US010868121B2

United States Patent
Cotton et al.

(10) Patent No.: US 10,868,121 B2
(45) Date of Patent: Dec. 15, 2020

(54) METHOD FOR FORMING APPARATUS COMPRISING TWO DIMENSIONAL MATERIAL

(71) Applicant: Nokia Technologies Oy, Espoo (FI)

(72) Inventors: Darryl Cotton, Grey (GB); Yinglin Liu, Cambridge (GB); Adam Robinson, Cambridge (GB); Alexander Bessonov, Cambridge (GB); Richard White, Cambridge (GB)

(73) Assignee: Nokia Technologies Oy, Espoo (FI)

( * ) Notice: Subject to any disclaimer, the term of this patent is extended or adjusted under 35 U.S.C. 154(b) by 93 days.

(21) Appl. No.: 15/753,745

(22) PCT Filed: Aug. 5, 2016

(86) PCT No.: PCT/FI2016/050550
§ 371 (c)(1),
(2) Date: Feb. 20, 2018

(87) PCT Pub. No.: WO2017/037333
PCT Pub. Date: Mar. 9, 2017

(65) Prior Publication Data
US 2018/0261672 A1    Sep. 13, 2018

(30) Foreign Application Priority Data
Aug. 28, 2015    (EP) .................................... 15182976

(51) Int. Cl.
*H01L 29/16* (2006.01)
*H01L 29/66* (2006.01)
(Continued)

(52) U.S. Cl.
CPC ..... *H01L 29/1606* (2013.01); *G01N 27/4146* (2013.01); *H01L 29/0653* (2013.01);
(Continued)

(58) Field of Classification Search
CPC ............ H01L 29/1606; H01L 29/0653; H01L 29/127; H01L 29/4238; H01L 29/778;
(Continued)

(56) References Cited

U.S. PATENT DOCUMENTS 8,673,683 B2    3/2014    Adkisson et al.
8,742,478 B2    6/2014    Chung et al.
(Continued)

FOREIGN PATENT DOCUMENTS

CN    103227203 A    7/2013
EP    1280617 A2    2/2003
(Continued)

OTHER PUBLICATIONS

Lee, "Graphene Field Effect Transistors for High Performance Flexible Nanoelectronics", Dissertation, May 2014, 114 pages.
(Continued)

*Primary Examiner* — Mouloucoulaye Inoussa
(74) *Attorney, Agent, or Firm* — Harrington & Smith (57) ABSTRACT

A method and apparatus, the method comprising: forming a layer of two dimensional material (23), in particular graphene, on a first release layer; forming, possibly a (gate) insulating layer (35), and at least two, preferably three, electrodes (25); forming a second release layer overlaying at least a portion of the layer of two dimensional material; providing a mouldable polymer (24, 26, 28) overlaying the at least two electrodes and the second release layer; and removing the first and second release layers to provide a cavity (29) between the mouldable polymer (26) and the layer of two dimensional material (23).

13 Claims, 7 Drawing Sheets

(51) Int. Cl.
  *H01L 29/778* (2006.01)
  *H01L 31/028* (2006.01)
  *H01L 29/12* (2006.01)
  *H01L 29/06* (2006.01)
  *H01L 29/417* (2006.01)
  *H01L 29/423* (2006.01)
  *G01N 27/414* (2006.01)
  *H01L 31/112* (2006.01)

(52) U.S. Cl.
  CPC ...... *H01L 29/127* (2013.01); *H01L 29/41725* (2013.01); *H01L 29/4238* (2013.01); *H01L 29/66045* (2013.01); *H01L 29/778* (2013.01); *H01L 31/028* (2013.01); *H01L 31/112* (2013.01); *Y02E 10/547* (2013.01)

(58) Field of Classification Search
  CPC ............... H01L 31/028; H01L 31/112; H01L 29/41725; H01L 29/66045; H01L 29/4908; H01L 29/78603; H01L 29/78606; H01L 29/78648; H01L 29/78684; H01L 29/0665; H01L 29/7781; H01L 29/78696; H01L 31/035209; H01L 31/101; H01L 31/02; H01L 29/66431; H01L 21/02527; G01N 27/4146; B81C 1/00158; B82Y 30/00; B82Y 10/00; Y02E 10/549; Y02P 70/521
  USPC ....... 257/9, E21.404, E29.245, 29, E31.003; 438/151, 57, 479
  See application file for complete search history.

(56) References Cited

U.S. PATENT DOCUMENTS

| | | |
|---|---|---|
| 2009/0140167 A1 | 6/2009 | Ward et al. |
| 2010/0127312 A1 | 5/2010 | Grebel et al. |
| 2011/0227043 A1 | 9/2011 | Guo et al. |
| 2013/0161587 A1 | 6/2013 | Xianyu et al. |
| 2013/0193410 A1 | 8/2013 | Zhu |
| 2014/0106514 A1* | 4/2014 | Hayashi .............. H01L 29/1606 438/151 |
| 2014/0299741 A1* | 10/2014 | Colli ............... H01L 31/035218 250/200 |

FOREIGN PATENT DOCUMENTS

| | | |
|---|---|---|
| EP | 2620982 A2 | 7/2013 |
| WO | 2001/080286 A2 | 10/2001 |
| WO | 2013/148349 A1 | 10/2013 |

OTHER PUBLICATIONS

Liu et al., "A Flexible Graphene FET Gas Sensor Using Polymer as Gate Dielectrics", IEEE 27th International Conference on Micro Electro Mechanical Systems, Jan. 26-30, 2014, 4 pages.

Lee et al., "Embedded-Gate Graphene Transistors for High-Mobility Detachable Flexible Nanoelectronics", Applied Physics Letters, vol. 100, 2012, pp. 1-4.

Lee et al., "Rigid Substrate Process to Achieve High Mobility in Graphene Field-Effect Transistors on a FlexibleSubstrate", Carbon 68, 2014, pp. 791-797.

Veen et al., "Flexible Graphene Devices With an Embedded Back-Gate", Graphene, vol. 2, No. 1, Jan. 2013, pp. 13-17.

Bolotin et al., "Ultrahigh Electron Mobility in Suspended Graphene", Solid State Communications, vol. 146, No. 9-10, Jun. 2008, pp. 351-355.

Cheng et al., "High-Frequency Self-Aligned Graphene Transistors With Transferred Gate Stacks", Proceedings of the National Academy of Sciences, vol. 109, No. 29, Jul. 17, 2012, pp. 11588-11592.

EP Application No. 15182390.3, "A Method for Forming Apparatus Comprising Two Dimensional Material", filed on Aug. 25, 2015, 29 pages.

Extended European Search Report received for corresponding European Patent Application No. 15182976.9, dated Mar. 3, 2016, 12 pages.

Liu et al., "Biological and Chemical Sensors Based on Graphene Materials", Chemical Society Reviews, vol. 41, No. 6, Mar. 21, 2012, pp. 2283-2307.

Wu et al., "Highly Sensitive Graphene Biosensors Based on Surface Plasmon Resonance", Optics Express, vol. 18, No. 14, 2010, pp. 14395-14400.

International Search Report and Written Opinion received for corresponding Patent Cooperation Treaty Application No. PCT/FI2016/050550, dated Oct. 24, 2016, 16 pages.

* cited by examiner

FIG. 5

METHOD FOR FORMING APPARATUS COMPRISING TWO DIMENSIONAL MATERIAL

RELATED APPLICATION

This application was originally filed as PCT Application No. PCT/FI2016/050550 filed Aug. 5, 2016 which claims priority benefit from EP Patent Application No. 15182976.9 filed Aug. 28, 2015.

TECHNOLOGICAL FIELD

Examples of the disclosure relate to a method for forming apparatus comprising two dimensional material. In particular, they relate to a method for forming electronic apparatus comprising a two dimensional material such as graphene.

BACKGROUND

Apparatus comprising two dimensional materials such as graphene are well known. For instance graphene can be provided in devices such as resistive sensors or field effect transistors to enable parameters such as chemicals or light to be detected. In other devices graphene field effect transistors can be used as logic elements or other electronic components.

It is useful to provide improved methods of forming such devices.

BRIEF SUMMARY

According to various, but not necessarily all, examples of the disclosure there may be provided a method comprising: forming a layer of two dimensional material on a first release layer; forming at least two electrodes; forming a second release layer overlaying at least a portion of the layer of two dimensional material; providing mouldable polymer overlaying the at least two electrodes and the second release layer; and removing the first and second release layers to provide a discontinuity between the mouldable polymer and the layer of two dimensional material.

In some examples the discontinuity may set the layer of two dimensional material and the mouldable polymer apart from each other.

In some examples the method may comprise providing a dielectric overlaying at least a portion of the layer of two dimensional material.

In some examples the second release layer may be formed so that at least part of the second release layer contacts the first release layer.

In some examples the method may comprise providing an inert material in the discontinuity.

In some examples the method may comprise providing nitrogen in the discontinuity.

In some examples the layer of two dimensional material and the at least two electrodes may form at least part of a field effect transistor. The field effect transistor may comprise a gate electrode and the gate electrode may be provided adjacent to the layer of two dimensional material. The field effect transistor may comprise a gate electrode and the gate electrode may be provided overlapping at least part of the layer of two dimensional material.

In some examples the method may comprise providing a rigid portion aligned with the discontinuity.

In some examples the two dimensional material may comprise graphene.

In some examples the method may comprise activating the layer of two dimensional material.

In some examples the method may comprise activating the layer of two dimensional material with quantum dots.

According to various, but not necessarily all, examples of the disclosure there may be provided an apparatus formed by any of the methods described above.

According to various, but not necessarily all, examples of the disclosure there may be provided an apparatus comprising: a layer of two dimensional material and at least two electrodes wherein the layer of two dimensional material was formed on a first release layer;
   mouldable polymer overlaying the at least two electrodes; and a discontinuity between the mouldable polymer and the layer of two dimensional material wherein the discontinuity is formed by a second release layer which has been removed.

In some examples the discontinuity may set the layer of two dimensional material and the mouldable polymer apart from each other.

In some examples the apparatus may comprise a dielectric overlaying at least a portion of the layer of two dimensional material.

In some examples the second release layer may be formed so that at least part of the second release layer contacts the first release layer.

In some examples the apparatus may comprise an inert material in the discontinuity.

In some examples the apparatus may comprise nitrogen in the discontinuity.

In some examples wherein the layer of two dimensional material and the at least two electrodes may form at least part of a field effect transistor. The field effect transistor may comprise a gate electrode and the gate electrode may be provided adjacent to the layer of two dimensional material. The field effect transistor may comprise a gate electrode and the gate electrode may be provided overlapping at least part of the layer of two dimensional material.

In some examples the apparatus may comprise a rigid portion aligned with the discontinuity.

In some examples the two dimensional material may comprise graphene.

In some examples the layer of two dimensional material may be activated. The layer of two dimensional material may be activated with quantum dots.

According to various, but not necessarily all, examples of the disclosure there is provided examples as claimed in the appended claims.

BRIEF DESCRIPTION

For a better understanding of various examples that are useful for understanding the detailed description, reference will now be made by way of example only to the accompanying drawings in which.

DETAILED DESCRIPTION

The Figures illustrate example methods and apparatus 21. The methods may be used to form apparatus 21 comprising two dimensional material. The apparatus 21 may form electronic components within electronic devices or parts of electronic components within electronic devices. In some examples the apparatus 21 which are formed may be for sensing. The apparatus 21 may be for sensing environmental parameters such as light, temperature, chemicals or other parameters.

Figure 1:
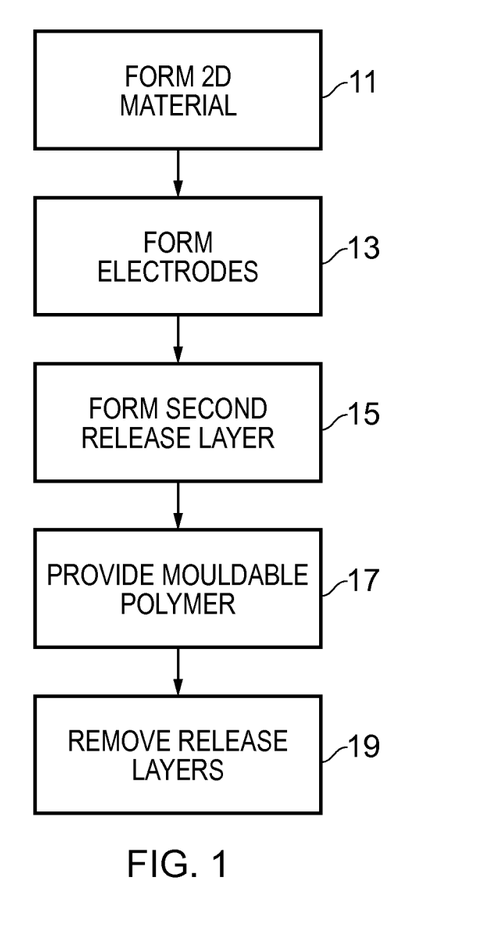
FIG. 1 illustrates a method.

FIG. 1 illustrates a method according to examples of the disclosure. The method may be used to form apparatus 21 comprising one or more electronic components. The electronic components may comprise a two dimensional material such as graphene.

The method comprises, at block 11, forming a layer of two dimensional material 23 on a first release layer 33. The method also comprises, at block 13, forming at least two electrodes 25 and, at block 15, forming a second release layer 37 overlaying at least a portion of the layer of two dimensional material 23. At block 17 the method comprises providing mouldable polymer 27 overlaying the at least two electrodes 25 and the second release layer 37. At block 19 the method comprises removing the first and second release layers 33, 37 to provide a discontinuity 29 between the mouldable polymer 27 and the layer of two dimensional material 23.

It is to be appreciated that the electrodes 25 and the layer of two dimensional material 23 may have any configuration which enables an electronic component to be formed. An example method for forming field effect transistor (FET) devices is illustrated in more detail in FIGS. 3A to 3I. Other methods for forming FETs and other types of devices may be used in other examples of the disclosure.

Figure 2:
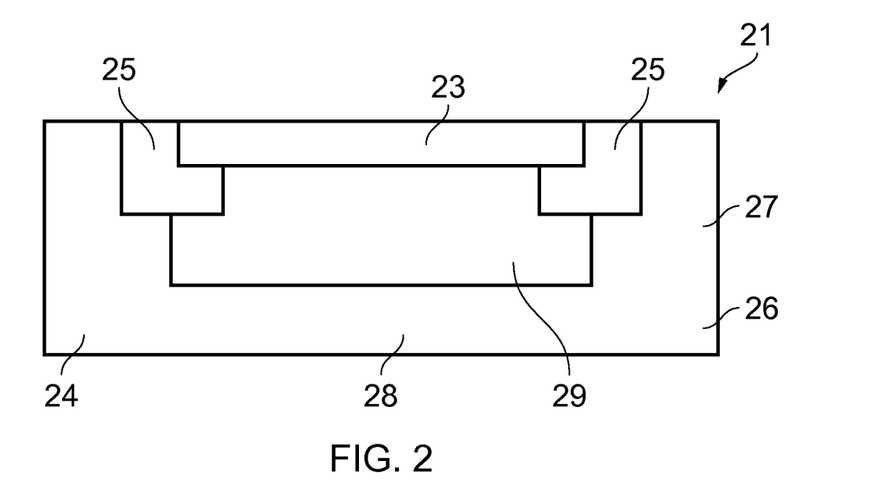
FIG. 2 illustrates an apparatus.

FIG. 2 illustrates a cross section of an example apparatus 21 which may be formed using methods such as the method of FIG. 1. The apparatus 21 comprises a layer of two dimensional material 23 and at least two electrodes 25. The layer of two dimensional material 23 was formed on a first release layer 33. The apparatus 21 also comprises mouldable polymer 27 overlaying the at least two electrodes 25 and a discontinuity 29 between the mouldable polymer 27 and the layer of two dimensional material 23. The discontinuity 29 is formed by a second release layer 37 which has been removed.

The layer of two dimensional material 23 may comprise a very thin layer of material. In some examples the layer of two dimensional material 23 could be an atomic monolayer. In some examples the layer of two dimensional material 23 could comprise several atomic monolayers. The layer of two dimensional material 23 could comprise graphene, molybdenum disulphide, boron nitride or any other suitable material.

The layer of two dimensional material 23 may have been formed on the surface of a first release layer 33. This may enable the other components of the apparatus 21 to be formed around the layer of two dimensional material 23.

In some examples the surface of the first release layer 33 may be smooth so that once the first release layer 33 has been removed this leaves a smooth layer of two dimensional material 23. As the first release layer 33 provides a smooth flat surface for forming the layer of two dimensional material 23 this reduces the amount of discontinuities and/or impurities in the layer of two dimensional material 23 and may provide for improved charge transfer characteristics of the two dimensional material 23.

In the example apparatus 21 of FIG. 2 the layer of two dimensional material 23 is provided between the at least two electrodes 25. The at least two electrodes 25 and the layer of two dimensional material 23 are arranged to form an electronic device or at least part of an electronic device. The example apparatus 21 of FIG. 2 could form a resistive sensor or other electronic device. It is to be appreciated that other electrodes or components could be comprised within the apparatus 21 to enable other electronic devices to be formed. For instance, in some examples the apparatus 21 could comprise source drain and gate electrodes which could be arranged around the layer of two dimensional material 23 to form a channel within an FET.

The electrodes 25 may comprise any suitable conductive material. The electrodes 25 may be electrically connected to the layer of two dimensional material 23. The electrodes 25 may be electrically connected to the layer of two dimensional material 23 to enable direct current to flow through the electrodes 25 and the layer of two dimensional material 23.

The electrodes 25 may be formed on the same first release layer 33 as the layer of two dimensional material 23. This may enable the electrodes 25 and the layer of two dimensional material 23 to be provided in the same plane. This reduces the number discontinuities such as step edges in the apparatus 21 which may provide for improved charge transfer characteristics of the two dimensional material 23.

The apparatus 21 also comprises a mouldable polymer 27. The mouldable polymer 27 may form a thin substrate. The thin substrate may support at least some of the components of the apparatus 21.

The mouldable polymer 27 is provided overlaying at least the two electrodes 25. The mouldable polymer 27 may be deposited overlaying the electrodes 25 while the electrodes 25 and layer of two dimensional material 23 are still positioned on the first release layer 33. Before the mouldable polymer 27 is deposited a second release layer 37 may be positioned overlaying at least part of the layer of two dimensional material 23. The second release layer 37 may be arranged to prevent the mouldable polymer 27 from contacting the layer of two dimensional material 23.

The mouldable polymer 27 may comprise any polymer material which is fluid enough to embed the electrodes 25 and layer of two dimensional material 23. Once the mouldable polymer 27 is provided around the electrodes 25 and the second release layer 37 the mouldable polymer 27 may be cured or otherwise hardened. Once the mouldable polymer 27 has hardened it may form a substrate for the at least two electrodes 25. Once the mouldable polymer 27 has hardened the second release layer 37 may be removed.

The mouldable polymer 27 has different thicknesses across the cross section of the apparatus 21. In the example of FIG. 2 the mouldable polymer 27 comprises a first portion 24, a second portion 26 and a third portion 28. The first portion 24 supports a first electrode 25 and the second portion supports a second electrode 25. The first and second portions 24, 26 of the mouldable polymer 27 may contact the electrodes 25. The first and second portions 24, 26 of the mouldable polymer 27 may have the same thickness.

The third portion 28 of the mouldable polymer 27 extends between the first and second portions 24, 26. The third portion 28 has a different thickness to the first and second portions 24, 26. The third portion 28 is thinner than the first and second portions 24, 26 so that the third portion 28 does not contact the electrodes 25 or the layer of two dimensional material 23. This creates a discontinuity 29 between the mouldable polymer 27 and the layer of two dimensional material 23. The discontinuity 29 sets the layer of two dimensional material 23 and the mouldable polymer 27 apart from each other.

The discontinuity 29 may provide a cavity within the substrate formed by the mouldable polymer 27. In some examples a material may be comprised within the cavity. In some examples the material within the cavity may comprise a fluid such as a gas. The fluid or gas may prevent the layer of two dimensional material 23 from contacting other layers of the apparatus 21.

In some examples a material within the cavity may be arranged to prevent contamination of the layer of two dimensional material 23. In some examples the material may comprise nitrogen or an inert material which may be arranged to prevent the layer of two dimensional material 23 from reacting with contaminants.

In some examples a vacuum could be provided within the discontinuity 29. The vacuum could be arranged to protect the layer of two dimensional materials from contaminants.

It is to be appreciated that the apparatus 21 could comprise other components that are not illustrated in FIG. 2. For instance the apparatus 21 could comprise layers of dielectric or additional electrodes 25 or contacts.

FIGS. 3A to 3I illustrate example methods which may be used to form example apparatus 21.

Figure 3A:
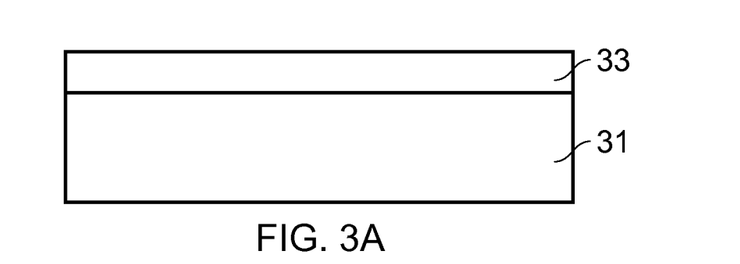
FIGS. 3A to 3I illustrate an example method.

In FIG. 3A a first release layer 33 is provided on a carrier substrate 31. In the example of FIG. 3A the carrier substrate 31 may provide a rigid or substantially rigid substrate which may provide support while the layer of two dimensional material 23 and/or other components of the apparatus 21 are being fabricated. The carrier substrate 31 may comprise a silicon wafer or any other suitable material. The carrier substrate 31 may be flat or substantially flat.

The first release layer 33 is provided overlaying the carrier substrate 31. The first release layer 33 may comprise a sacrificial layer which may enable the components of the apparatus 21 such the layer of two dimensional material 23 to be removed from the carrier substrate 31. The material that is used for the first release layer 33 may depend on the components that are being fabricated and the materials that are being used for those components. In some examples the first release layer 33 may comprise copper, nickel or any other suitable material. Using a material such as copper or nickel for the first release layer 33 may enable the layer of two dimensional material 23 to be grown on the first release layer 33.

Figure 3B:
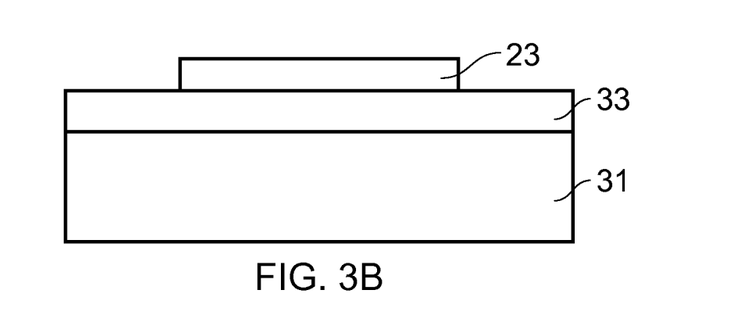

In FIG. 3B a layer of two dimensional material 23 is deposited onto the first release layer 33. In the example of FIGS. 3A to 3G the two dimensional material 23 comprises graphene. Other two dimensional materials may be used in other examples of the disclosure.

In some examples the graphene may be grown directly on the first release layer 33. This may avoid having to transfer the graphene between different substrates. This may reduce stresses and/or other defects within the graphene and provide improved charge carrier characteristics.

In other examples the graphene may be deposited on the first release layer 33 using chemical vapour deposition, a wet transfer process, a dry transfer process or any other suitable process.

The graphene may be patterned on the first release layer 33 in order to provide the correct channel dimensions for the apparatus 21.

Figure 3C:
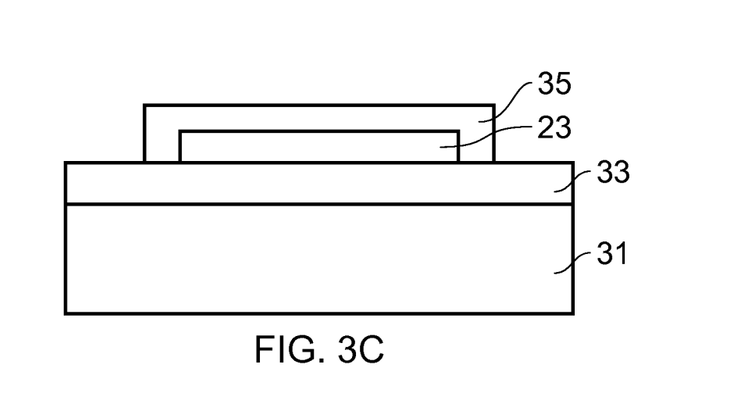

In FIG. 3C a dielectric 35 is deposited over the graphene. The dielectric 35 may be provided in a thin layer. The dielectric 35 may be deposited so that it completely covers the graphene. In the example of FIG. 3C, where the graphene is still attached to the first release layer 33, the first release layer 33 and the dielectric 35 completely envelop the graphene.

The dielectric 35 may be arranged to provide an electrically insulating layer between the graphene and one or more of the electrodes 25 or other components of the apparatus 21.

The dielectric 35 may comprise any suitable electrically insulating material. In some examples the dielectric 35 may comprise aluminum oxide which could be deposited using atomic layer deposition or any other suitable process. In some examples the dielectric 35 may comprise a polymer or any other suitable material.

In some examples the dielectric 35 may also be arranged as a barrier to protect the graphene from contamination. For instance the dielectric 35 could comprise a material which is impermeable, or partially impermeable to contaminants such as water or oxygen or anything else which could contaminate or affect the charge carrier characteristics of the graphene.

In some examples the graphene may be activated before the dielectric 35 is deposited. The activation of the graphene may counteract the low surface energy of the graphene and may enable uniform deposition of the dielectric 35 over the graphene. For instance, a seed layer may be evaporated onto the graphene to enable the atomic layer deposition of the dielectric 35.

Figure 3D:
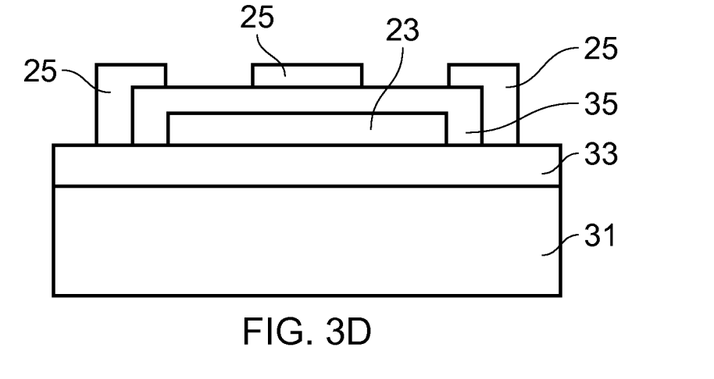

In FIG. 3D a plurality of electrodes 25 are deposited onto the first release layer 33. In the example of FIGS. 3A to 3G the electrodes 25 comprise source, drain and gate electrodes. The electrodes 25 are deposited so that at least part of the electrodes 25 extend over the dielectric 35. The source and drain electrodes 25 are deposited so that at least part of the source and drain electrodes 25 are in direct contact with the surface of the first release layer 33. This may enable contacts to be provided between the electrodes 25 and the graphene once the first release layer 33 has been removed.

In the example of FIG. 3D the electrodes 25 are formed so that at least the source and drain electrodes 25 are in the same plane as the graphene. This reduces the number of step edges in the apparatus 21 which may provide for improved charge mobility.

The electrodes 25 may be formed using any suitable technique. For instance, in some examples the electrodes 25 may be formed by photolithography followed by evaporation of the electrode material or by evaporating through a shadow mask or any other suitable technique.

Figure 3E:
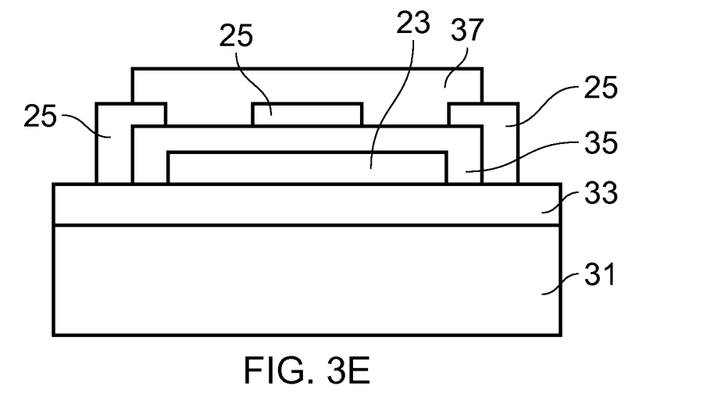

In FIG. 3E a second release layer 37 is formed. The second release layer 37 is formed overlaying at least a part of layer of two dimensional material 23. In the example of FIG. 3E the second release layer 37 is formed overlaying both the dielectric 35 and the graphene. In such examples the dielectric 35 may act as a protective barrier for the graphene. In the example of FIG. 3E the second release layer 37 also overlays at least some of the electrodes 25.

The second release layer 37 may be formed so that the second release layer 37 can be removed with the first release layer 33. The second release layer 37 may be formed so that least part of the second release layer 37 contacts the first release layer 33.

The second release layer 37 may be formed using any suitable technique. For instance, in some examples the second release layer 37 may be formed by photolithography followed by evaporation of the release layer material 37, by evaporating through a shadow mask, by using a liftoff process using a photo resist mask or any other suitable technique.

The second release layer 37 may be formed from any suitable material. The second release layer 37 may be formed form a material which will not react or otherwise contaminate the graphene. The second release layer 37 may comprise a material which can be removed by chemical etching or any other suitable technique. In some examples the second release layer 37 may comprise the same material as the first release layer 33.

Figure 3F:
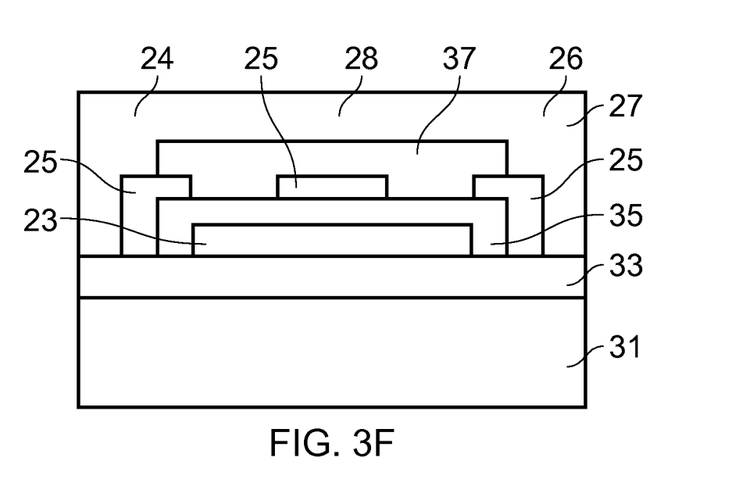

In FIG. 3F mouldable polymer 27 is provided overlaying the layer of graphene, the electrodes 25, the dielectric 35 and the second release layer 37. The mouldable polymer 27 is deposited on the first release layer 33 overlaying the layer of graphene, the electrodes 25, the dielectric 35 and the second release layer 37. The mouldable polymer 27 comprises any polymer which will embed the components of the apparatus 21. The mouldable polymer 27 may form a planar surface against the surface of the first release layer 33.

The second release layer 37 may be positioned so as to prevent the mouldable polymer 27 from contacting the layer of graphene. In the example of FIGS. 3A to 3I the second release layer 37 prevents the mouldable polymer 27 from coming into contact with the dielectric 35. The second release layer 37 may provide a barrier between the mouldable polymer 27 and the layer of graphene and/or the dielectric 35. The second release layer 37 may be positioned so that the mouldable polymer 27 forms different portions 24, 26, 28 of different thicknesses. The different portions 24, 26, 28 of different thicknesses may be as described above.

In some examples the mouldable polymer 27 may comprise a liquid polymer which may be deposited onto the first release layer 33 via spin coating, spray coating or any other suitable process. In other examples the mouldable polymer 27 may comprise a polymer foil which may be deposited by hot embossing or any other suitable process.

Figure 3G:
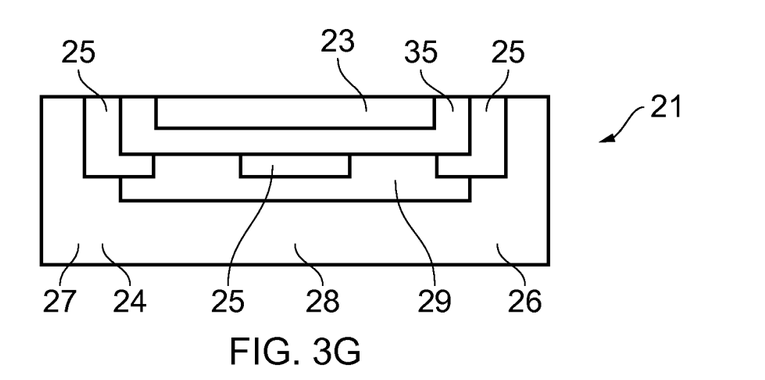

In FIG. 3G the carrier substrate 31 and the first release layer 33 and second release layer 37 are removed. The mouldable polymer 27 may be hardened or cured before the carrier substrate 31 and release layers 33, 37 are removed so that the mouldable polymer 27 provides a substrate for the apparatus 21.

The first release layers 33 and the second release layers 37 may be removed simultaneously. The release layers 33, 37 may be removed using any suitable technique such as chemical etching.

Figure 3H:
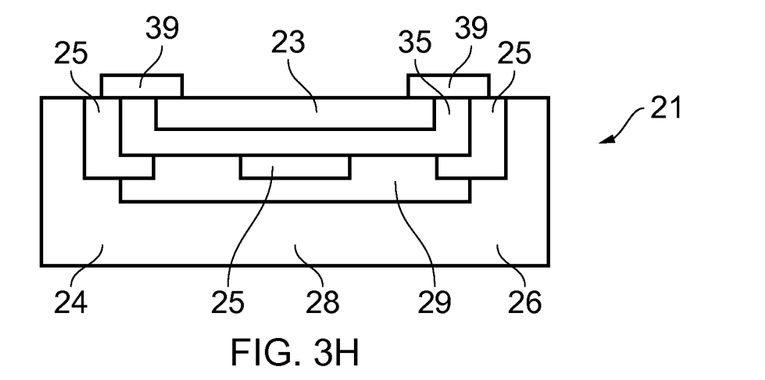

In FIG. 3H contacts 39 are provided between the source and drain electrodes 25 and the graphene. The contacts 39 may provide a direct current path between the source and drain electrodes 25 and the graphene. The contacts 39 may comprise any conductive material, such as a metal, which may be deposited between the electrodes 25 and the graphene. The contacts 39 may enable the graphene and electrodes 25 to form an FET.

The contacts 39 may be deposited using photolithography, metal evaporation or any other suitable process. In some examples the apparatus 21 may be treated with argon plasma before the contacts 39 are deposited to reduce the resistance of the contacts 39.

Figure 3I:
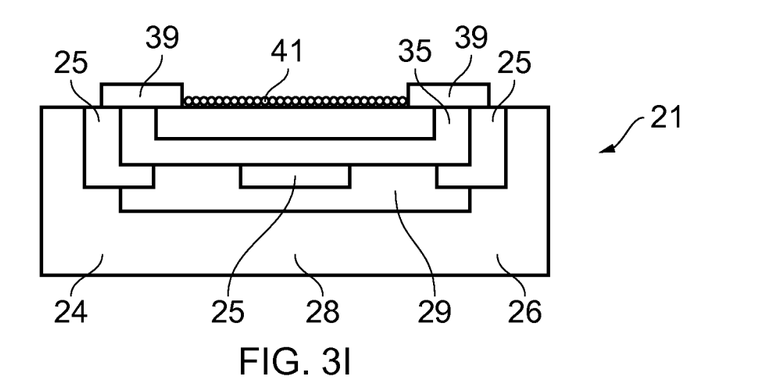

In FIG. 3I the graphene is activated. The activation of the graphene may enable the FET to be used as a sensor. In the example of FIG. 3I the graphene is activated with quantum dots 41. The material that is used to activate the graphene may depend on the parameters that the FET is intended to detect. In some examples the graphene might not be activated.

In the examples of FIGS. 3A to 3I the apparatus 21 comprises a bottom gate FET. It is to be appreciated that the methods could be modified to provide an apparatus 21 comprising a top gate FET. For instance the gate electrode of the top gate FET could be deposited on the surface of the moldable polymer 27 after the first release layer 33 has been removed. Other apparatus 21 could be formed using other similar methods.

Figure 4:
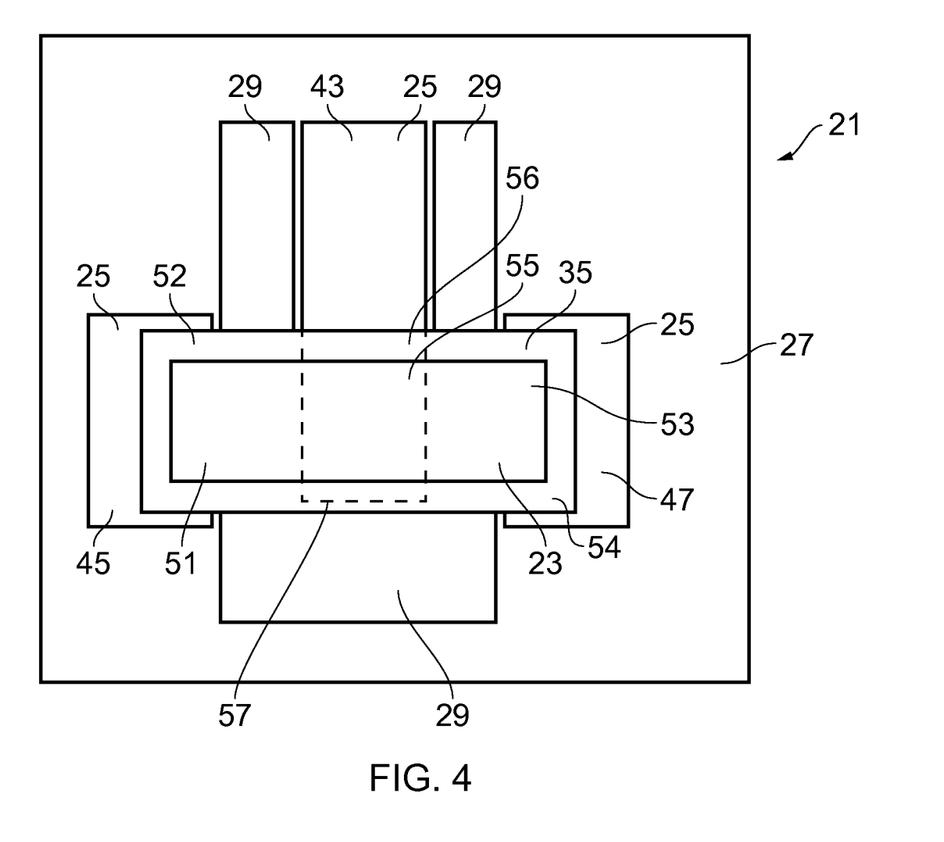
FIG. 4 is a plan view of an apparatus.

FIG. 4 is a plan view of another example apparatus 21. The example apparatus of FIG. 4 may be formed using the methods described above. The apparatus 21 comprises a layer of two dimensional material 23, a plurality of electrodes 25 moldable polymer 27 and a discontinuity 29 which may be as described above. Corresponding reference numerals are used for corresponding features. The plurality of electrodes 25 and the layer of two dimensional material 23 are arranged to form an FET.

The layer of two dimensional material 23 is provided spanning the discontinuity 29. A first end 51 of the layer of two dimensional material 23 is supported by the moldable polymer 27 on a first side of the discontinuity 29. A second end 53 of the layer of two dimensional material 23 is supported by the moldable polymer 27 on a second side of the discontinuity 29. The first side may be opposite to the second side. A middle portion 55 is provided between the two ends 51, 53 of the layer of two dimensional material 23. The middle portion 55 of the layer of two dimensional material extends over the discontinuity 29 so that the middle portion of the layer of two dimensional material 23 is set a distance apart from the moldable polymer 27.

In the example of FIG. 4 a dielectric 35 layer is provided underneath the layer of two dimensional material 23. In some examples the dielectric 35 may be arranged to support the layer of two dimensional material 23 across the discontinuity 29.

In FIG. 4 the dielectric 35 is provided spanning the discontinuity 29. A first end 52 of the layer of dielectric 35 is supported by the moldable polymer 27 on the first side of the discontinuity 29. A second end 54 of the dielectric 35 is supported by the moldable polymer 27 on the second side of the discontinuity 29. The first side may be opposite to the second side. A middle portion 56 is provided between the two ends 52, 54 of the dielectric 35. The middle portion 56 of the dielectric 35 extends over the discontinuity 29 so that the middle portion of the dielectric 35 is set a distance apart from the moldable polymer 27.

The apparatus 21 also comprises a source electrode 45 and a drain electrode 47. The source electrode 45 and drain electrode 47 may be supported by the mouldable polymer 27 so that the mouldable polymer 27 bears the weight of both the source electrode 45 and the drain electrode 47.

The source electrode 45 is provided on the first side of the discontinuity 29 and may be arranged to be connected to the first end 51 of the layer of two dimensional material 23. The drain electrode 47 is provided on the second side of the discontinuity 29 and is arranged to be connected to the second end 53 of the layer of two dimensional material 23.

The apparatus 21 also comprises a gate electrode 43. In the example of FIG. 4 the gate electrode overlaps a portion of the layer of two dimensional material 23. In the example of FIG. 4 a portion of the gate electrode 43 extends across the discontinuity 29 underneath the middle portion 56 of the dielectric 35 and the middle portion 55 of the layer of two dimensional material 23. The portion of the gate electrode 43 which extends underneath the layer of two dimensional material 23 is indicated by the dashed line 57 in FIG. 4. The dielectric 35 may insulate the layer of the two dimensional material 23 and the gate electrode 43.

In the example of FIG. 4 at least part of the gate electrode 43 may be supported by the moldable polymer 27. The discontinuity 29 may have a U-shape so that the portion of the gate electrode 43 which is not overlapping with the layer of two dimensional material 23 is provided on the moldable polymer 27. The moldable polymer 27 may extend up to the edge of the layer of two dimensional material 23 to reduce bending forces on the gate electrode 43.

Figure 5:
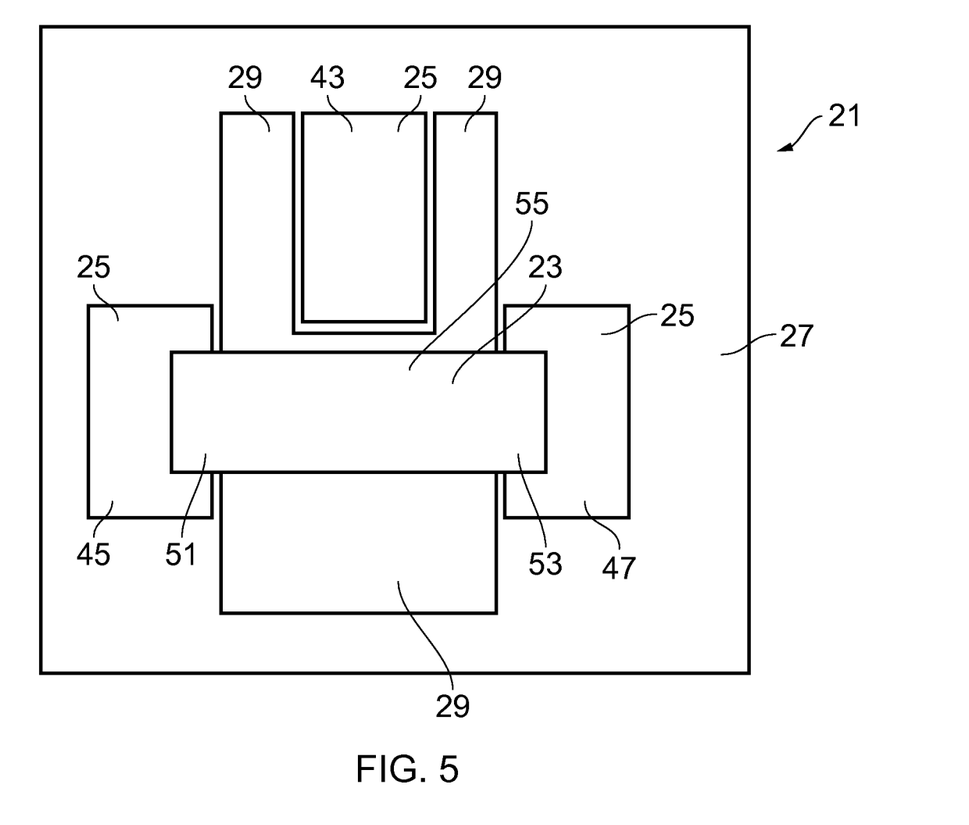
FIG. 5 is a plan view of another apparatus.

FIG. 5 is a plan view of another example apparatus 21. The example apparatus of FIG. 5 is similar to the example apparatus 21 of FIG. 4 and may also be formed using the methods described above. The apparatus 21 of FIG. 5 comprises a layer of two dimensional material 23, a plurality of electrodes 25 moldable polymer 27 and a discontinuity 29 which may be as described above. Corresponding reference numerals are used for corresponding features. The plurality of electrodes 25 and the layer of two dimensional material 43 are arranged to form an FET.

In FIG. 5 the apparatus 21 comprises a layer of two dimensional material 23 which spans across a discontinuity 29 as in FIG. 4. The apparatus 21 also comprises a source electrode 45 and a gate electrode 47 which may also be as in FIG. 4.

However in FIG. 5 the gate electrode 43 does not extend underneath the layer of two dimensional material 23. In FIG. 5 the gate electrode 43 is positioned adjacent to the middle portion 55 of the layer of two dimensional material 23. The gate electrode 43 is positioned close to, but not touching, the middle portion 55 of the layer of two dimensional material 23.

In the example of FIG. 5 the whole of the gate electrode 43 may be supported by the moldable polymer 27. The discontinuity 29 may have a U-shape so that the gate electrode 43 can be provided on the moldable polymer 27 and positioned adjacent to the layer of two dimensional material 23. The moldable polymer 27 may extend up to the edge of the layer of two dimensional material 23 to enable the gate electrode 43 to be provided close to but not touching the layer of two dimensional material 23.

In the example apparatus 21 of FIG. 5 no dielectric 35 is provided supporting the layer of two dimensional material 23. In the example of FIG. 5 air, nitrogen or other insulating fluid may be provided within the cavity formed by discontinuity 29. The air or other fluid may act as a dielectric and provide electrical insulation between the gate electrode 43 and the layer of two dimensional material 23.

It is to be appreciated that other components may be provided within the apparatus which are not illustrated in FIGS. 1 to 5. For instance, in some examples a rigid portion may be provided within the apparatus 21. The rigid portion may be aligned with the discontinuity 29 and may be arranged to prevent the discontinuity 29 from bending or otherwise deforming. This may help to prevent damage being caused to the layer of two dimensional material 23 and other components within the apparatus 21.

Examples of the disclosure provide methods of forming apparatus 21 comprising two or more electrodes 25 and a channel of two dimensional material 23. Providing the discontinuity 29 between the moldable polymer 27 substrate and the layer of two dimensional material 23 prevents the moldable polymer 27 from deforming or otherwise contaminating the layer of two dimensional material 23. This may reduce the number of defects within the layer of two dimensional material 23 which increases carrier mobility within the layer of two dimensional material 23 and provides for an improved apparatus 21.

In some examples the discontinuity 29 may comprise a gas or other fluid which may be configured to prevent contamination of the layer of two dimensional material 23. This may further reduce defects within the layer of two dimensional material 23.

Examples of the disclosure may enable the apparatus 21 to be formed around the layer of two dimensional material 23. This may avoid the need to transfer the layer of two dimensional material 23 which will reduce the chance of the layer of two dimensional material 23 being damaged or otherwise contaminated. As the layer of two dimensional material 23 does not need to be transferred between different substrates this may reduce stresses within the layer which could be formed as the layer is removed from and attached to different substrates. This may also reduce the number of defects within the layer of two dimensional material 23

The methods of the disclosure may enable large numbers of apparatus 21 to be produced at low costs. The method may be fast as processes such as curing may only take several seconds to be completed. The method may avoid the use of high temperatures which could damage sensitive components. For instance the thermosetting resins may be set at temperatures of 200° C. which may be low enough to avoid damaging other components of the apparatus 21.

In the above description the term "coupled" means operationally coupled. Any number of intervening components may be provided including no intervening components.

The term "comprise" is used in this document with an inclusive not an exclusive meaning. That is any reference to X comprising Y indicates that X may comprise only one Y or may comprise more than one Y. If it is intended to use "comprise" with an exclusive meaning then it will be made clear in the context by referring to "comprising only one . . . " or by using "consisting".

In this brief description, reference has been made to various examples. The description of features or functions in relation to an example indicates that those features or functions are present in that example. The use of the term "example" or "for example" or "may" in the text denotes, whether explicitly stated or not, that such features or functions are present in at least the described example, whether described as an example or not, and that they can be, but are not necessarily, present in some of or all other examples. Thus "example", "for example" or "may" refers to a particular instance in a class of examples. A property of the instance can be a property of only that instance or a property of the class or a property of a sub-class of the class that includes some but not all of the instances in the class. It is therefore implicitly disclosed that a features described with reference to one example but not with reference to another example, can where possible be used in that other example but does not necessarily have to be used in that other example.

Although examples of the disclosure have been described in the preceding paragraphs with reference to various examples, it should be appreciated that modifications to the examples given can be made without departing from the scope of the invention as claimed.

Features described in the preceding description may be used in combinations other than the combinations explicitly described.

Although functions have been described with reference to certain features, those functions may be performable by other features whether described or not.

Although features have been described with reference to certain examples, those features may also be present in other embodiments whether described or not.

Whilst endeavoring in the foregoing specification to draw attention to those features of the invention believed to be of particular importance it should be understood that the Applicant claims protection in respect of any patentable feature or combination of features hereinbefore referred to and/or shown in the drawings whether or not particular emphasis has been placed thereon.

We claim:

1. A method comprising:
   forming a layer of material on a first release layer;
   forming at least two electrodes on the first release layer;
   forming a second release layer overlaying at least a portion of the layer of material, wherein the second release layer is formed so that at least part of the second release layer contacts the first release layer;
   providing mouldable polymer overlaying at least part of the at least two electrodes respectively, and the second release layer, wherein the mouldable polymer is a non-metallic polymer; and
   removing the first release layer and removing the second release layer to provide a cavity between the mouldable polymer and the layer of material.

2. A method as claimed in claim 1 wherein the cavity sets the layer of material and the mouldable polymer apart from each other.

3. A method as claimed in claim 1 comprising providing dielectric overlaying at least a portion of the layer of material.

4. A method as claimed in claim 1 comprising providing an inert material in the cavity.

5. A method as claimed in claim 1 comprising providing nitrogen in the cavity.

6. A method as claimed in claim 1 wherein the layer of material and the at least two electrodes form at least part of a field effect transistor.

7. A method as claimed in claim 6 wherein the field effect transistor comprises a gate electrode and the gate electrode is provided adjacent to the layer of material.

8. A method as claimed in claim 6 wherein the wherein the field effect transistor comprises a gate electrode and the gate electrode is provided overlapping at least part of the layer of material.

9. A method as claimed in claim 1 comprising providing a rigid portion aligned with the cavity, wherein the rigid portion is arranged to prevent the cavity from bending or otherwise deforming.

10. A method as claimed in claim 1 wherein the material comprises graphene.

11. A method as claimed in claim 1 comprising activating the layer of material.

12. A method as claimed in claim 1 comprising activating the layer of material with quantum dots.

13. An apparatus formed by:
    forming a layer of material on a first release layer;
    forming at least two electrodes on the first release layer;
    forming a second release layer overlaying at least a portion of the layer of material, wherein the second release layer is formed so that at least part of the second release layer contacts the first release layer;
    providing mouldable polymer overlaying at least part of the at least two electrodes respectively, and the second release layer, wherein the mouldable polymer is a non-metallic polymer; and
    removing the first release layer and removing the second release layer to provide a cavity between the mouldable polymer and the layer of material.

* * * * *